United States Patent
Kuo et al.

[11] Patent Number: 6,061,268
[45] Date of Patent: May 9, 2000

[54] 0.7V TWO-PORT 6T SRAM MEMORY CELL STRUCTURE WITH SINGLE-BIT-LINE SIMULTANEOUS READ-AND-WRITE ACCESS (SBLSRWA) CAPABILITY USING PARTIALLY-DEPLETED SOI CMOS DYNAMIC-THRESHOLD TECHNIQUE

[76] Inventors: James B. Kuo; Sheng-Che Liu, both of Department of Electrical Engineering, National Taiwan University, Taipei, Taiwan

[21] Appl. No.: 09/427,727

[22] Filed: Oct. 27, 1999

[51] Int. Cl.[7] .................................................. G11C 11/00
[52] U.S. Cl. ........................................ 365/156; 365/154
[58] Field of Search ...................................... 365/156, 154, 365/165, 176, 188, 189.09, 214

[56] References Cited

U.S. PATENT DOCUMENTS

| | | | |
|---|---|---|---|
| 5,706,226 | 1/1998 | Chan et al. | 365/154 |
| 5,774,393 | 6/1998 | Kuriyama | 365/156 |
| 5,943,528 | 8/1999 | Houston et al. | 365/154 |

*Primary Examiner*—Vu A. Le
*Attorney, Agent, or Firm*—Bacon & Thomas, PLLC

[57] ABSTRACT

This invention discloses a novel low-voltage two-port 6T SRAM memory cell structure with single-bit-line simultaneous read-and-write access capability using partially-depleted SOI CMOS dynamic-threshold technique. With an innovative approach by connecting the body terminal of an NMOS device in the latch and the write access pass transistor to the write word line, this 6T memory cell can be used to provide SBLSRWA capability for 0.7 V two-port SOI CMOS VLSI SRAM as verified by MEDICI results.

3 Claims, 2 Drawing Sheets

0.7V TWO-PORT 6T SRAM MEMORY CELL STRUCTURE WITH SINGLE-BIT-LINE SIMULTANEOUS READ-AND-WRITE ACCESS (SBLSRWA) CAPABILITY USING PARTIALLY-DEPLETED SOI CMOS DYNAMIC-THRESHOLD TECHNIQUE

FIELD OF THE INVENTION

The present invention is related to two-port 6T SRAMs with simultaneous read and write capability, and in particular to 0.7 V two-port SOI (silicon-on-insulator) CMOS VLSI SRAMs with single-bit-line simultaneous read-and-write access capability.

BACKGROUND OF THE INVENTION

For standard two-port SRAMs with simultaneous read and write capability, two more pass transistors and an extra pair of bit lines in addition to the conventional 6T SRAM memory cell are needed. Techniques with single-bit-line read and write have been studied for reducing the size of the two-port SRAM memory cell [K. Sasaki, et al, "A 16-Mb CMOS SRAM with a 2.3 um² Single-Bit-Line Memory Cell," IEEE J. Solid St. Ckts, Vol. 28, pp. 1125–1130, November 1993]. However, for the 6T SRAM memory cell with the single-bit-line write structure, write logic-1 operation via the single bit line is difficult due to the ratioed logic structure involved. This problem is especially serious for the lowvoltage environment. Recently, SOI CMOS dynamic threshold technique has been reported for its advantages in low-voltage logic circuits [J. B. Kuo and K. W. Su, "CMOS VLSI Engineering: Silicon-on-Insulator (SOI)," Kluwer: Dordrecht, 1998.; F. Assaderaghi, et al, "A Dynamic Threshold voltage MOSFET (DTMOS) for Very Low Voltage Operation," IEEE Elec. Dev. Let., Vol. 15, pp. 510–512, December 1994].

SUMMARY OF THE INVENTION

The present invention discloses an improved two-port 6T SRAM cell structure with single-bit-line simultaneous read-and-write access (SBLSRWA) capability and is suitable to be operated at a voltage as low as 0.7 V.

The improved two-port 6T SRAM cell structure comprises two PMOS's, designated as $M_{P1}$ and $M_{P2}$; four NMOS's, designated as $M_{N1}$, $M_{N2}$, $M_{N3}$ and $M_{N4}$; one write word line; one write bit line; one read word line; and one read bit line, wherein a drain of one NMOS $M_{N3}$ is connected to that of a PMOS $M_{P1}$ at a first node n1 while their gates are tied together at a second node n2; a source of $M_{N3}$ is connected to ground and that of $M_{P1}$ is connected to a supply voltage $V_{dd}$; a drain of another NMOS $M_{N4}$ is connected to that of another PMOS $M_{P2}$ at the second node n2 while their gates are tied together at the first node n1; a source of $M_{N4}$ is connected to the ground and that of $M_{P2}$ is connected to the supply voltage $V_{dd}$; the other two NMOS's are pass transistors, one of them $M_{N1}$ is controlled by the write word line via gate, and its drain and source are connected to the write bit line and the first node n1 respectively; another one of them $M_{N2}$ is controlled by the read word line via gate, and its drain and source are connected to the read bit line and the second node n2 respectively, in which the improvement comprises a body terminal of the NMOS $M_{N1}$ is connected to the write word line, and a body terminal of the NMOS $M_{N4}$ is connected to the write word line, so that a threshold voltage of each of the NMOS $M_{N1}$ and NMOS $M_{N4}$ is lowered from its original value when a voltage of the write word line is pulled from zero to an elevated value, such as about 0.7 V.

Preferably, a body terminal of each of the PMOS $M_{P1}$, PMOS $M_{P2}$, NMOS $M_{N2}$, and $M_{N3}$ is floating.

The SBLSRWA SRAM cell of the present invention is obtained due to the dynamic-threshold MOS (DTMOS) effect of NMOS $M_{N1}$ and NMOS $M_{N4}$.

BRIEF DESCRIPTION OF THE DRAWINGS

FIG. 2 is a time versus voltage plot showing transients during the write access of the 0.7 V SOI CMOS two-port 6T SBLSRWA SRAM cell shown in FIG. 1, wherein the voltage of write word line (WWL) is shown by . . . ; that of the write bit line (WBL) is shown by . . . ; that of the node n1 is shown by . . . ; and that of the node n2 is shown by . . . .

DETAILED DESCRIPTION OF THE INVENTION

In this invention, by using the dynamic threshold technique in connecting the body terminal of an NMOS device ($M_{N4}$) in the latch and the write access pass transistor ($M_{N1}$) to the write word line of a 0.7 V two-port 6T SRAM cell, a single-bit-line simultaneous read-and-write access thereof is accomplished.

The 0.7 V two-port 6T SRAM cell structure with single-bit-line simultaneous read-and-write access (SBLSRWA) capability of the present invention using partially-depleted SOI CMOS dynamic-threshold techniques comprises two PMOS's, four NMOS's, one write word line, one write bit line, one read word line and one read bit line; wherein two NMOS's ($M_{N3}$ and $M_{N4}$) and two PMOS's ($M_{P1}$ and $M_{P2}$) of them make up a pair of inverters which are needed by a latch, then data can be stored in nodes n1 and n2; the other two NMOS's ($M_{N1}$ and $M_{N2}$) are pass transistors; the body terminals of the transistors $M_{N1}$ and $M_{N4}$ are connected to the write word line, the node n1 is connected to the write bit line via the transistor $M_{N1}$ and the node n2 is connected to the read bit line via the transistor $M_{N2}$.

Figure 1:
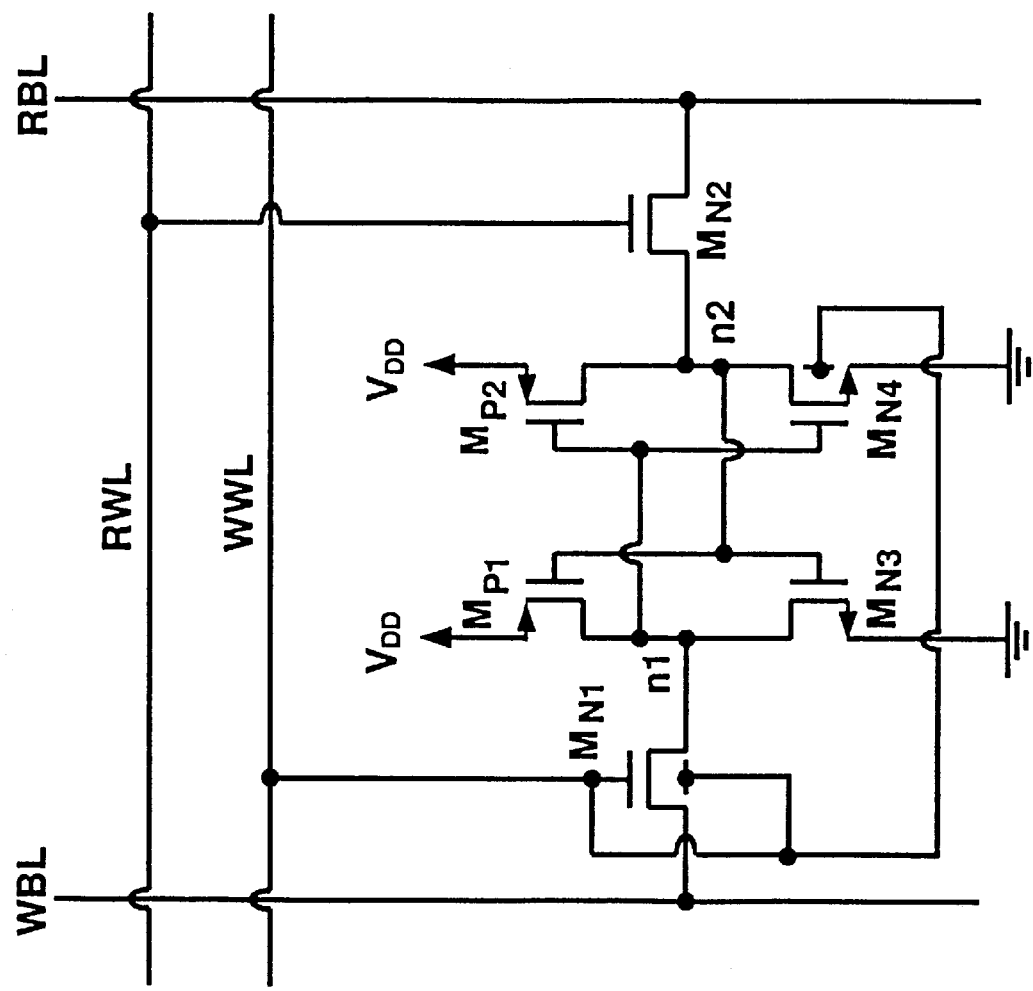
FIG. 1 is a schematic diagram showing 0.7 V two-port 6T SRAM cell structure with single-bit-line simultaneous read-and-write access (SBLSRWA) capability of the present invention by using SOI CMOS dynamic-threshold technique.

FIG. 1 shows the 0.7 V two-port 6T SRAM memory cell structure with single-bit-line simultaneous read-and-write access (SBLSRWA) capability using partially-depleted SOI CMOS dynamic-threshold technique. As shown in the figure, the body terminal of the NMOS device $M_{N4}$ in the latch is connected to the write word line (WWL) instead of floating as in the conventional SOI CMOS SRAM memory cell. In the SBLSRWA memory cell, the left side is connected to the write bit line (WBL) via the pass transistor $M_{N1}$, which is controlled by write word line (WWL) and with its body tied to WWL. The right side of the SBLSRWA SRAM memory cell is connected to the read bit line (RBL) via the pass transistor $M_{N2}$, which is controlled by the read word line (RWL). By this arrangement, simultaneous read and write accesses of the SBLSRWA SRAM memory cell can be facilitated.

Consider the write-logic-1 operation with logic-0 stored at node n1 initially and WBL is high at 0.7 V. During the single-bit-line write-logic-1 operation, when WWL becomes high, the body of the NMOS devices $M_{N1}$ and $M_{N4}$ is tied to high at 0.7 V. Due to the DTMOS effect, the threshold voltage of $M_{N4}$ and $M_{N1}$ is lowered such that both $M_{N4}$ and $M_{N1}$ turn on faster. As a result, $M_{N3}$ turns off faster and node n1 is pulled to 0.7 V more easily. When the write access is over, WWL becomes low at 0 V, the threshold voltage of $M_{N4}$ and $M_{N1}$ goes back to its original value.

Figure 2:
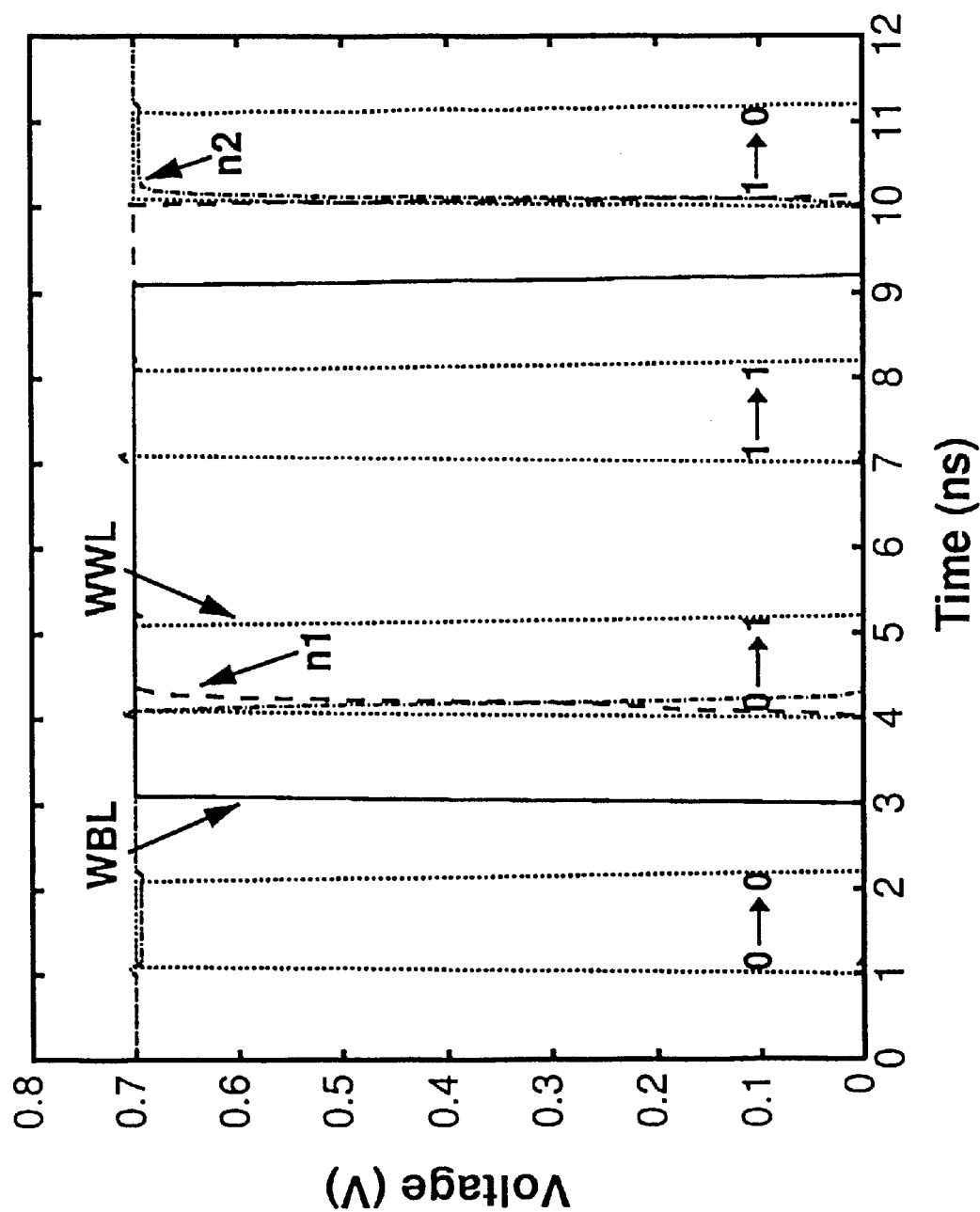

In order to investigate the effectiveness of the new 2-port SRAM memory cell, transients during the write access of this SBLSRWA SRAM memory cell at 0.7 V have been studied. In the SBLSRWA SRAM memory cell under study, all six transistors have an aspect ratio of 0.3um/0.2um. Two parasitic capacitances of 0.1p are placed at WBL and RBL. FIG.2 shows the transient waveforms during the write access of this SBLSRWA 6T SRAM memory cell at $V_{dd}$ of 0.7 V from MEDICI simulation results based on a 0.2um partially-depleted SOI CMOS technology. As shown in the figure, at $V_{dd}$ of 0.7 V, for the four cases of the write access—(1)logic-0→logic-0 (logic-0 is written into the storage node n1, which is stored with logic-0 initially), (2)logic-0→logic-1, (3)logic-1→logic-1, and (4)logic-1→logic-0, write operations can be done for this two-port SBLSRWA 6T SRAM memory cell using this innovative structure. Without using this innovative structure, single-bit-line write-logic-1 operation of the two-port 6T SRAM cell at $V_{dd}$ of 0.7 V is not possible.

What is claimed is:

1. An improved two-port 6T SRAM cell structure comprising two PMOS's, designated as $M_{P1}$ and $M_{P2}$; four NMOS's, designated as $M_{N1}$, $M_{N2}$, $M_{N3}$ and $M_{N4}$; one write word line; one write bit line; one read word line; and one read bit line, wherein a drain of the NMOS $M_{N3}$ is connected to that of the PMOS $M_{P1}$ at a first node n1 while their gates are tied together at a second node n2; a source of the NMOS $M_{N3}$ is connected to ground and that of the PMOS $M_{P1}$ is connected to a supply voltage $V_{dd}$; a drain of the NMOS $M_{N4}$ is connected to that of the PMOS $M_{P2}$ at the second node n2 while their gates are tied together at the first node n1; a source of the NMOS $M_{N4}$ is connected to the ground and that of the PMOS $M_{P2}$ is connected to the supply voltage $V_{dd}$; the two NMOS $M_{N1}$ and NMOS $M_{N2}$ are pass transistors, one of them $M_{N1}$ is controlled by the write word line via its gate, and its drain and source are connected to the write bit line and the first node n1 respectively; another one of them $M_{N2}$ is controlled by the read word line via its gate, and its drain and source are connected to the read bit line and the second node n2 respectively, in which the improvement comprises a body terminal of the NMOS $M_{N1}$ is connected to the write word line, and a body terminal of the NMOS $M_{N4}$ is connected to the write word line, so that a threshold voltage of each of the NMOS $M_{N1}$ and NMOS $M_{N4}$ is lowered from its original value when a voltage of the write word line is pulled from zero to an elevated value.

2. The two-port 6T SRAM cell structure according to claim 1, wherein a body terminal of each of the PMOS $M_{P1}$, PMOS $M_{P2}$, NMOS $M_{N2}$, and $M_{N3}$ is floating.

3. The two-port 6T SRAM cell structure according to claim 1, wherein the elevated value is about 0.7 V.

\* \* \* \* \*